(12) United States Patent
Li (10) Patent No.: US 7,495,917 B2
(45) Date of Patent: Feb. 24, 2009

(54) HEAT DISSIPATION DEVICE

(75) Inventor: Dong-Yun Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 111 days.

(21) Appl. No.: 11/309,840

(22) Filed: Oct. 10, 2006

(65) Prior Publication Data

US 2008/0030959 A1 Feb. 7, 2008

(51) Int. Cl.
*H05K 7/20* (2006.01)

(52) U.S. Cl. .................. 361/704; 361/695; 361/703; 257/718; 257/719; 257/727; 165/80.3; 165/185

(58) Field of Classification Search .................. None
See application file for complete search history.

(56) References Cited

U.S. PATENT DOCUMENTS

| 5,386,338 | A | | 1/1995 | Jordan et al. | |
|---|---|---|---|---|---|
| 5,464,054 | A | | 11/1995 | Hinshaw et al. | |
| 5,677,829 | A | * | 10/1997 | Clemens | 361/697 |
| 6,466,443 | B1 | * | 10/2002 | Chen | 361/695 |
| 6,648,664 | B1 | * | 11/2003 | McHugh et al. | 439/331 |
| 6,717,814 | B2 | * | 4/2004 | Li | 361/704 |
| 6,822,864 | B2 | * | 11/2004 | Huang et al. | 361/697 |
| 6,822,869 | B2 | * | 11/2004 | Huang et al. | 361/704 |
| 7,233,496 | B2 | * | 6/2007 | Lee et al. | 361/720 |
| 7,243,709 | B2 | * | 7/2007 | Chen et al. | 165/122 |
| 7,283,367 | B2 | * | 10/2007 | Yu et al. | 361/719 |
| 7,327,575 | B2 | * | 2/2008 | Yu et al. | 361/719 |

\* cited by examiner

*Primary Examiner*—Boris L Chervinsky
(74) *Attorney, Agent, or Firm*—Jeffrey T. Knapp (57) ABSTRACT

A heat dissipation device includes a retention module (60), a heat sink (10), a fan bracket (50), a fan (70) mounted on the fan bracket, and a pair of wire clips (30) cooperating with the fan bracket and the retention module to secure the heat sink to a heat-generating electronic element (82). The retention module forms a pair of fixture blocks (64) at a pair of lateral sidewalls thereof. The heat sink defines grooves (160) at lateral sides thereof. Each of the clips includes an operating portion (356) fastened to the fan bracket, a central axle (33) connecting with the operating portion and a locking portion (31) connecting with the central axle. Each central axle is slidably engaged in corresponding grooves of the heat sink and the locking portions of the clips engage with the fixture blocks of the retention module.

20 Claims, 7 Drawing Sheets

HEAT DISSIPATION DEVICE

FIELD OF THE INVENTION

The present invention relates generally to a heat dissipation device, and more particularly to a heat dissipation device incorporating a retention module for securing the heat dissipation device to a heat generating electronic device.

DESCRIPTION OF RELATED ART

It is well known that heat is produced during operation of electronic devices such as central processing units (CPUs). The heat produced must be quickly removed to ensure normal operation of the CPU. Typically, a heat sink assembly is used to remove heat from the CPU.

Conventionally, a heat sink assembly comprises a heat sink, a retention module receiving the CPU therein and a clip. The clip is used for fastening the heat sink onto the CPU in the retention module to keep the heat sink in intimate contact with the CPU. An example of a related heat sink assembly is disclosed in U.S. Pat. No. 5,464,054. In this assembly, a wire clip fastens a heat sink onto an electronic device. The wire clip comprises a central portion and two fastening portions each extending from an opposite end of the central portion. The heat sink comprises a base and a plurality of fins extending upwardly from the base. A longitudinal slot is defined in the base for receiving the central portion of the clip. The central portion of the wire clip is retained in the slot. End portions are formed at free ends of fastening portions, for engaging with corresponding tabs extending from opposite sidewalls of the retention module, thereby resiliently securing the heat sink to the electronic device. However, it is awkward and difficult to manipulate the wire clip to mount the heat sink to the electronic device; furthermore, when subjected to vibration or shock during use, the clip is prone to rotate in a plane that is parallel to the base and is prone to move along an extending direction of the slot. This can adversely affect thermal engagement of the heat sink with the electronic device.

SUMMARY OF THE INVENTION

A heat dissipation device in accordance with a preferred embodiment of the present invention comprises a retention module, a heat sink, a fan bracket, a fan mounted on the heat sink via the fan bracket, and a pair of wire clips cooperating with the fan bracket and the retention module to secure the heat sink to a heat-generating electronic element. The retention module forms a pair of fixture blocks at a pair of lateral sidewalls thereof. The heat sink defines grooves at lateral sides thereof. Each of the clips includes an operating portion fastened to the fan bracket, a central axle connecting with the operating portion and a locking portion connecting with the central axle. The central axle is slidably engaged in corresponding grooves of the heat sink and the locking portion of each of the clips engages with a corresponding fixture block of the retention module.

Other advantages and novel features of the present invention will become more apparent from the following detailed description when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
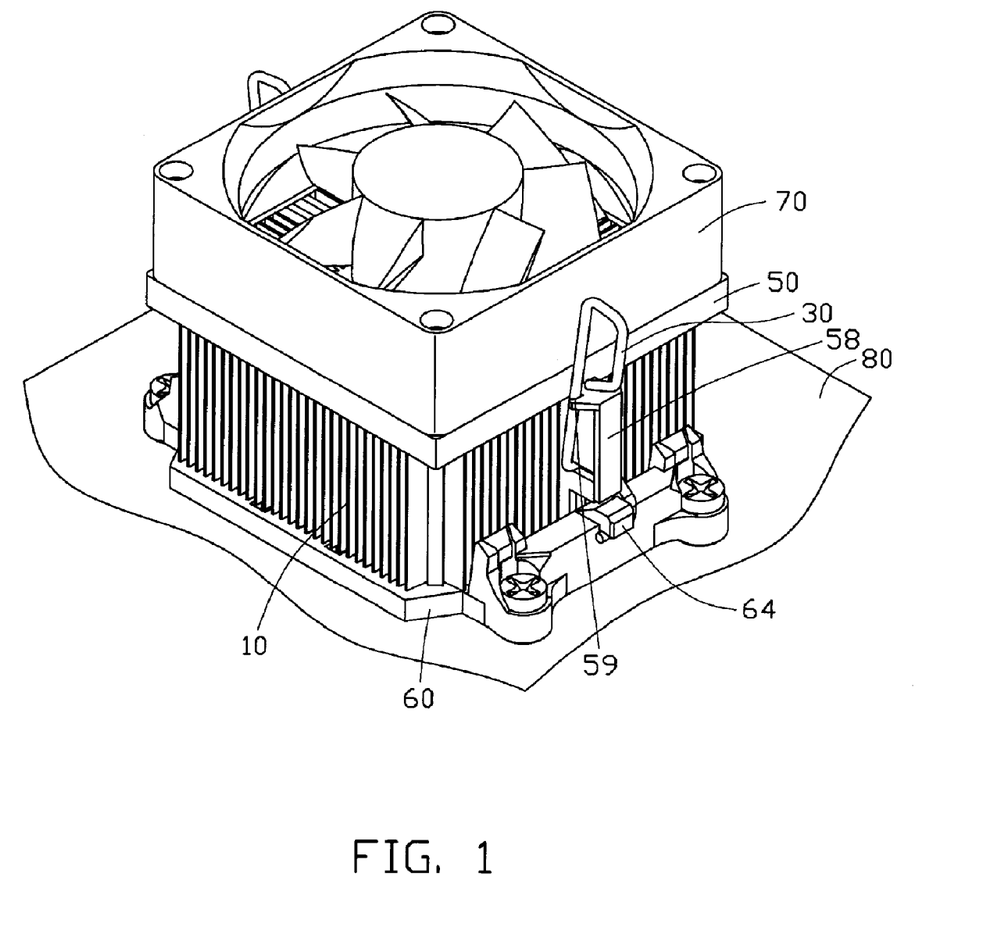
FIG. 1 is an assembled view of a heat dissipation device in accordance with a preferred embodiment of the present invention.
Figure 2:
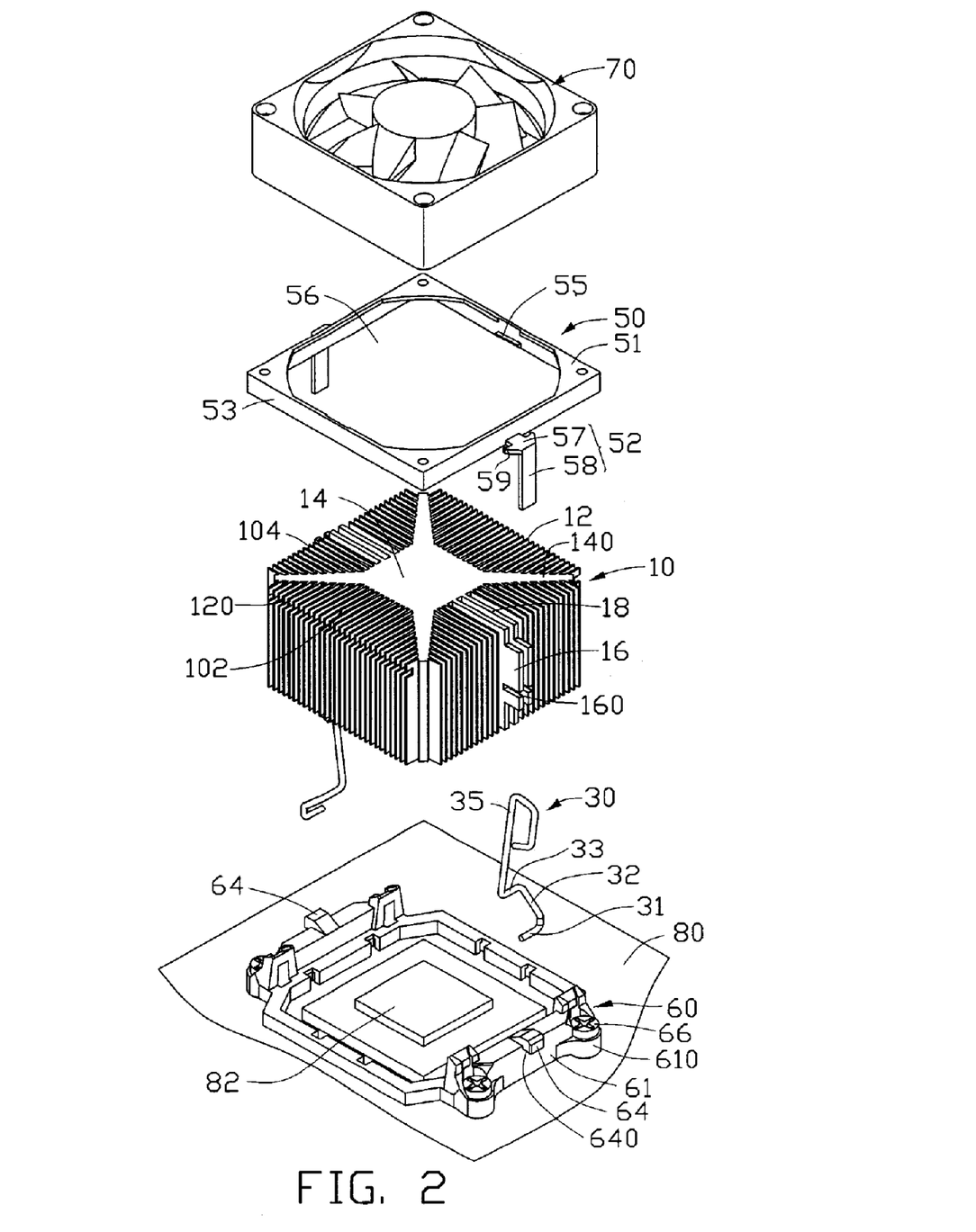
FIG. 2 is an exploded, isometric view of FIG. 1.
Figure 3:
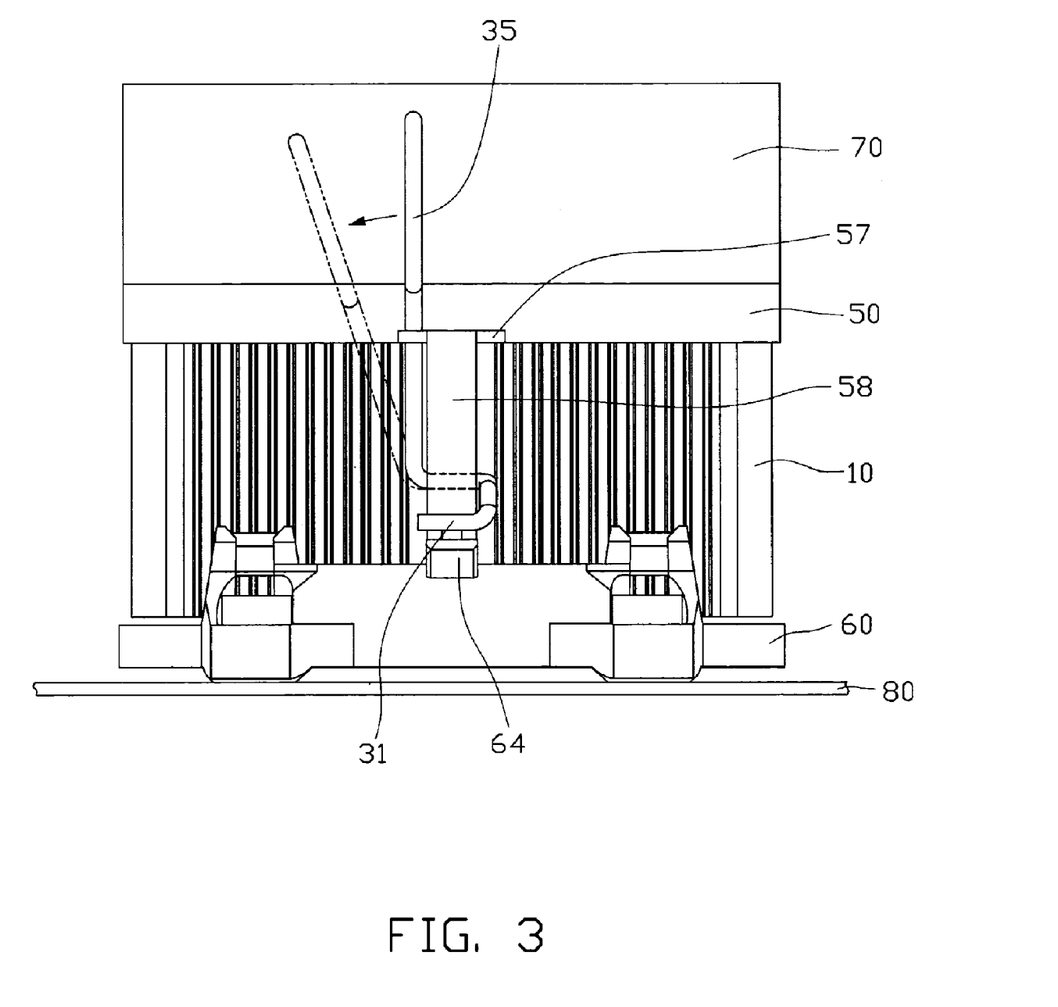
FIG. 3 is a side view of FIG. 1 with a clip located at an unlocked position.

Referring to FIGS. 1-3, a heat dissipation device in accordance with a preferred embodiment of the present invention comprises a heat sink 10, a retention module 60, a fan bracket 50, a fan 70 mounted on the heat sink 10 via the fan bracket 50 and a pair of wire clips 30 cooperating with the retention module 60 and the fan bracket 50 to secure the heat sink 10 to a heat-generating electronic component such as a CPU 82 located on a printed circuit board 80 and surrounded by the retention module 60.

The retention module 60 is a substantially rectangular frame and comprises four interconnecting sidewalls 61 located around the CPU 82. The retention module 60 forms a post 610 at each of four corners thereof. Four screws 66 extend through the posts 610 to mount the retention module 60 on the printed circuit board 80. A pair of fixture blocks 64 are formed on a center of a pair of opposite lateral sidewalls 61. A corresponding portion of each block 64 extending beyond each lateral sidewall 16 forms a concave surface 640 at a bottom thereof.

The heat sink 10 is mounted on the CPU 82 in the retention module 60, and comprises a solid core 14 shaped similar to a cube and four symmetrical branches 140 extending outwardly from four edges of the core 14. A plurality of fins 12 project outwardly from sides of the core 14 and the branches 140. The fins 12 can be divided into four groups each oriented towards a different direction. Four side surfaces of the core 14 and the four branches 140 form four regions comprising a first pair of opposing fin groups 102 and a second pair of opposing fin groups 104. Each group of the fins 12 is formed at a corresponding region. Two neighboring groups of the fins 12 are oriented perpendicularly to each other. A pair of adjacent and spaced locating plates 18 respectively extend from a center of a pair of lateral sides of the core 14. Each of the locating plates 18 has a thickness thicker than that of each fin 12 and has the same height as that of the fins 12. Each of the locating plates 18 is aligned parallel to the fins 12 and has a tab 16 extending outwardly and horizontally beyond extremity of the fins 12. A height of each tab 16 is smaller than that of the fins 12. The tabs 16 each define straight grooves 160 at a bottom portion thereof. The grooves 160 extend along a horizontal direction. The grooves 160 of the tabs 16 have free ends to facilitate engagement with the clips 30. The fins 12 located at the first pair of groups 102 define recesses 120 at extremities of an upper portion thereof, for mounting the fan bracket 50 on the heat sink 10.

Each of the clips 30 can be integrally made from an unitary metal wire and can comprise a linear and horizontal central axle 33 received in the grooves 160 of adjacent two tabs 16, an operating portion 35 extending perpendicularly and upwardly from one free end of the central axle 33 and a linear extension portion 32 bent perpendicularly and slantingly downwards from the other free end of the central axle 33. The extension portion 32 terminates at a locking portion 31 corresponding to the block 64 of the retention module 60. The central axle 33 extends in a direction perpendicular to the extending direction of the grooves 160 of the heat sink 10. The central axle 33 is capable of horizontally moving in the grooves 160 toward or away from the heat sink 10. The operating portion 35 is bent to form a P-shaped configuration for facilitating manipulation and capable of rotating around the central axle 33. The operating portion 35 is located at an upper side of the tabs 16 and the extension and locking portions 32, 31 are located at an opposite lower side of the tabs 16. The locking portion 31 is slantingly downwardly bent from a free end of the extension portion 32 to form an L-shaped configuration for clasping the concave surface 640 of the block 64 of the retention module 60. A perpendicular distance between a top end of the operating portion 35 and the central axle 33 is longer than a distance between a bottom end of the locking portion 31 and the central axle 33. Thus, the clips 30 are preferably configured to provide the necessary leverage for locking or unlocking the clips 30 to the retention module 60.

The fan bracket 50 has a square configuration, and comprises a mounting plate 51 and four sidewalls 53 extending downwardly from the mounting plate 51. An opening 56 is defined in the mounting plate 51 for providing passage of airflow generated by the fan 70 towards the heat sink 10. A pair of longitudinal sidewalls 53 form tongues 55 extending inwardly from a central bottom edge thereof, for engaging in the corresponding recesses 120 of the heat sink 10 thereby mounting the fan bracket 50 onto the heat sink 10. L-shaped locking plates 52 are bent from a pair of lateral sidewalls 53, positioned corresponding to position of the tabs 16 of the heat sink 10. Each of the locking plates 52 comprises a supporting plate 57 extending horizontally from a central bottom edge of the corresponding lateral sidewall 53 and a baffle plate 58 perpendicularly and downwardly extending from a free end of the supporting plate 57. Each supporting plate 57 is positioned on a top surface of the tabs 16 of the locating plates 18. Each supporting plate 57 has a T-shaped configuration forming a clasp 59 engaging with the operating portion 35 of each clip 30. Each baffle plate 58 abuts against an outer extremity of two adjacent tabs 16 to prevent the central axle 33 of each clip 30 from sliding off from the grooves 160 of the tabs 16 of the heat sink 10. The fan 70 is mounted on the fan bracket 50 via screws (not shown).

Figure 4:
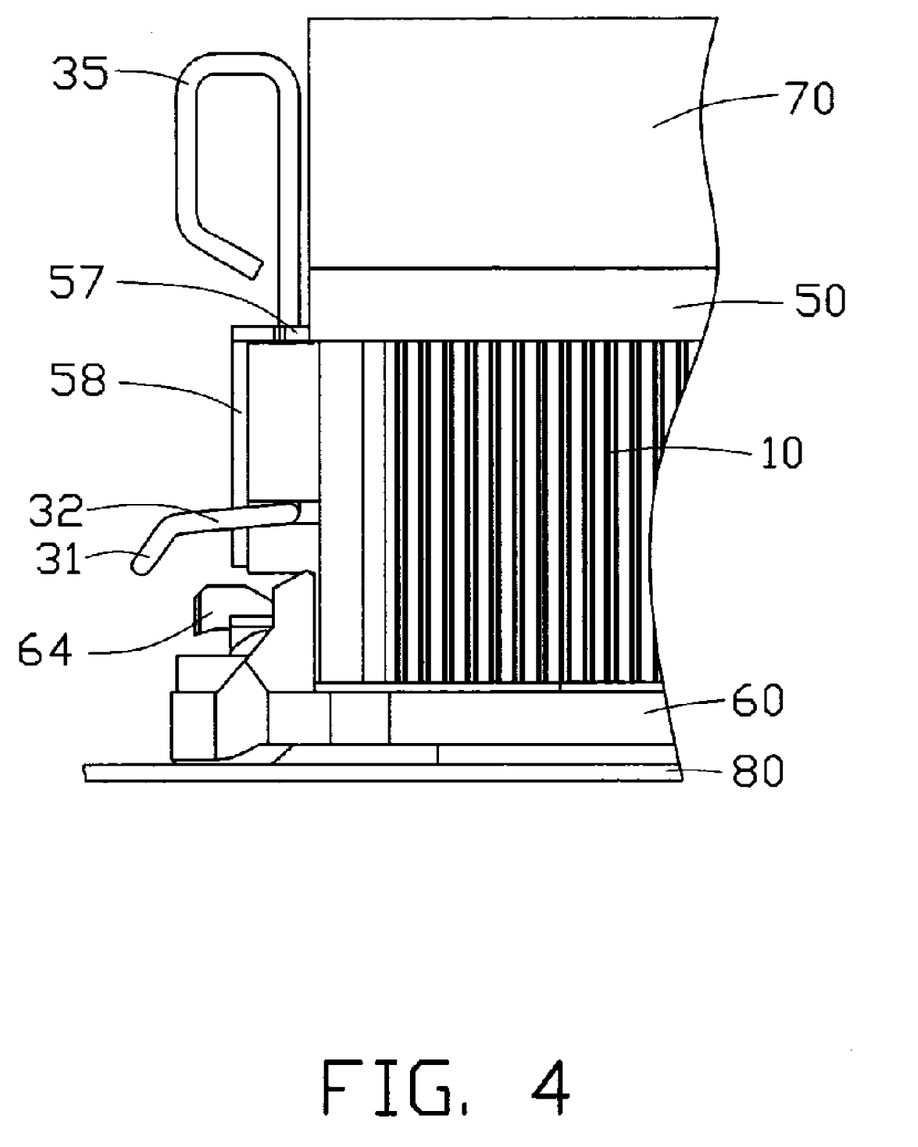
FIGS. 4-6 are front-end, partly cut-away views of FIG. 1 with the clip located at the unlocked position.
Figure 5:
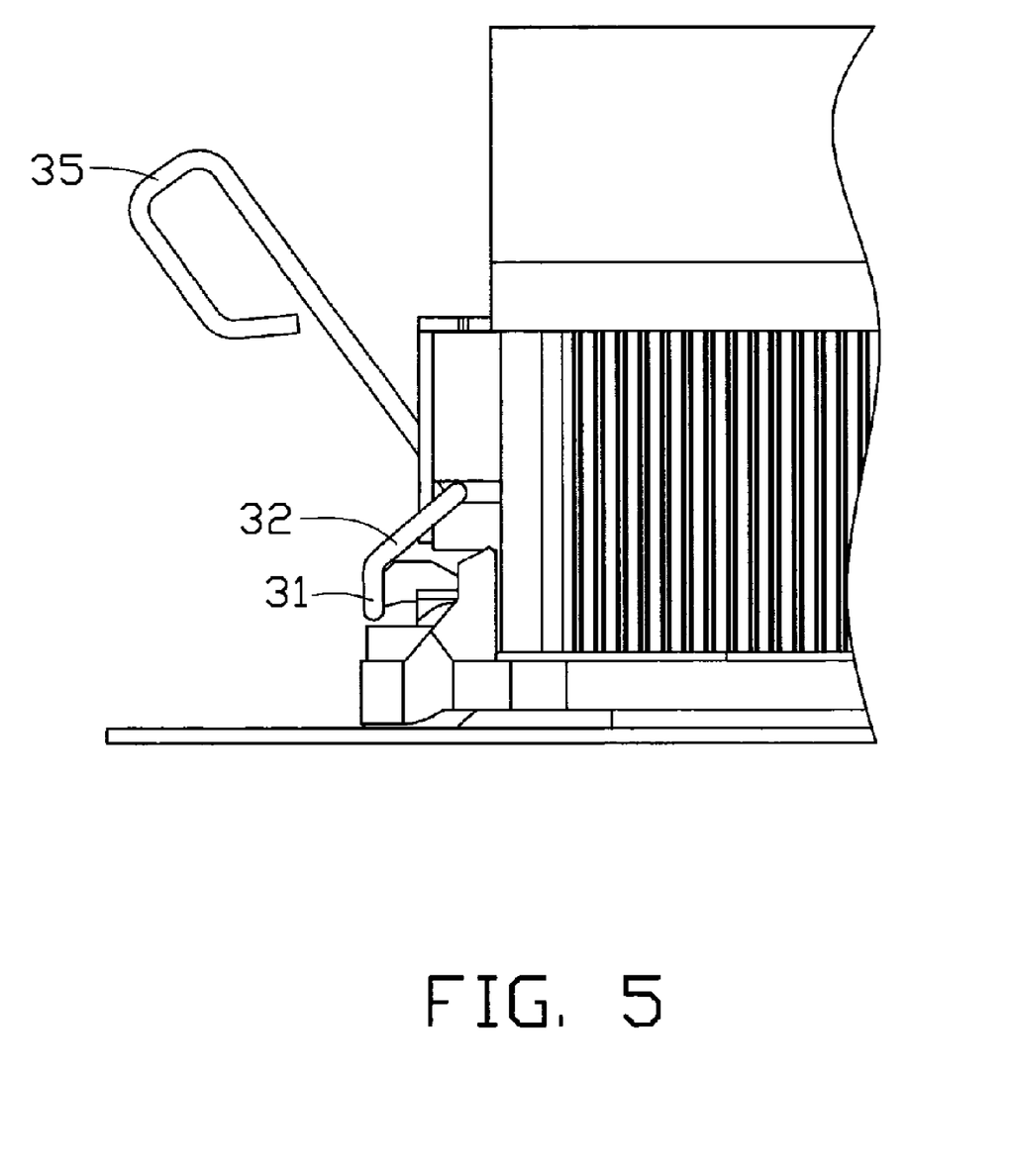
Figure 6:
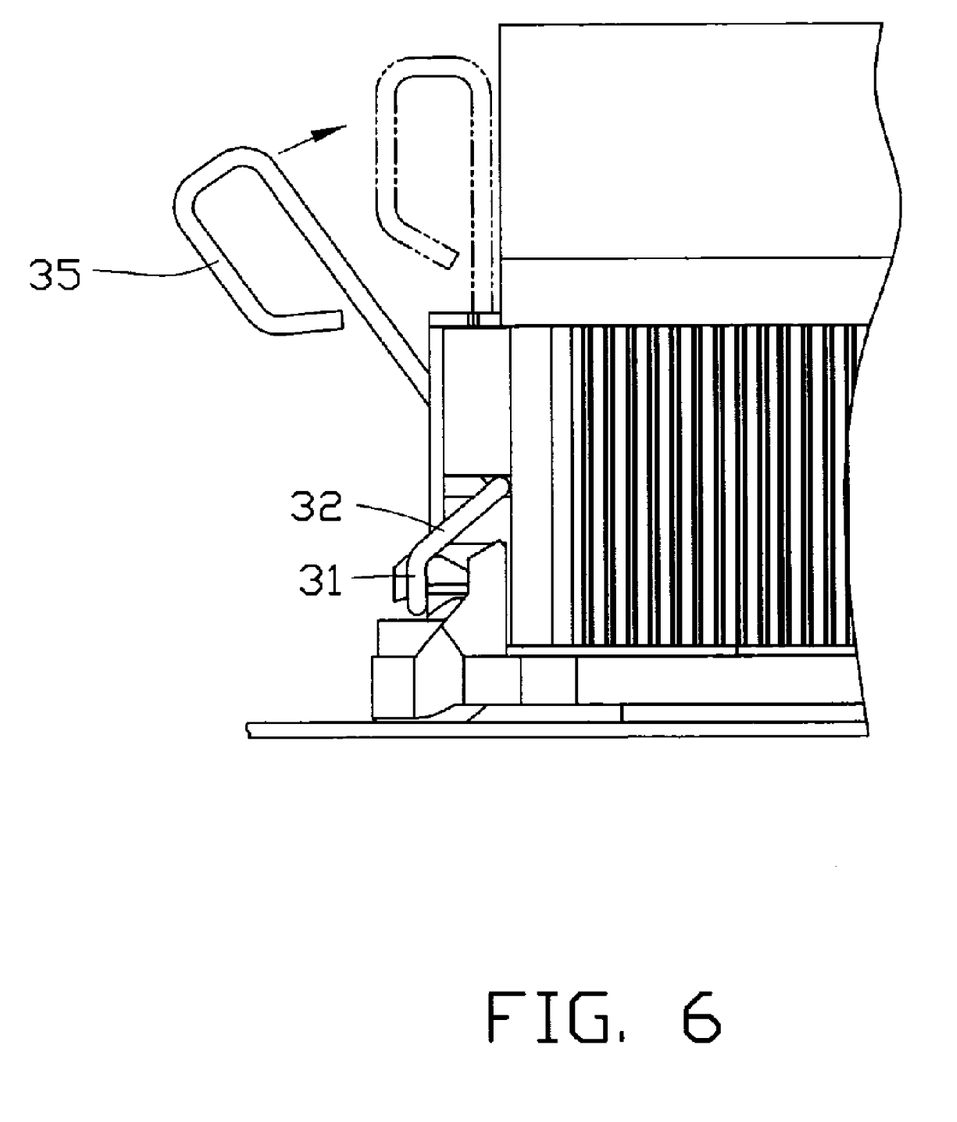
Figure 7:
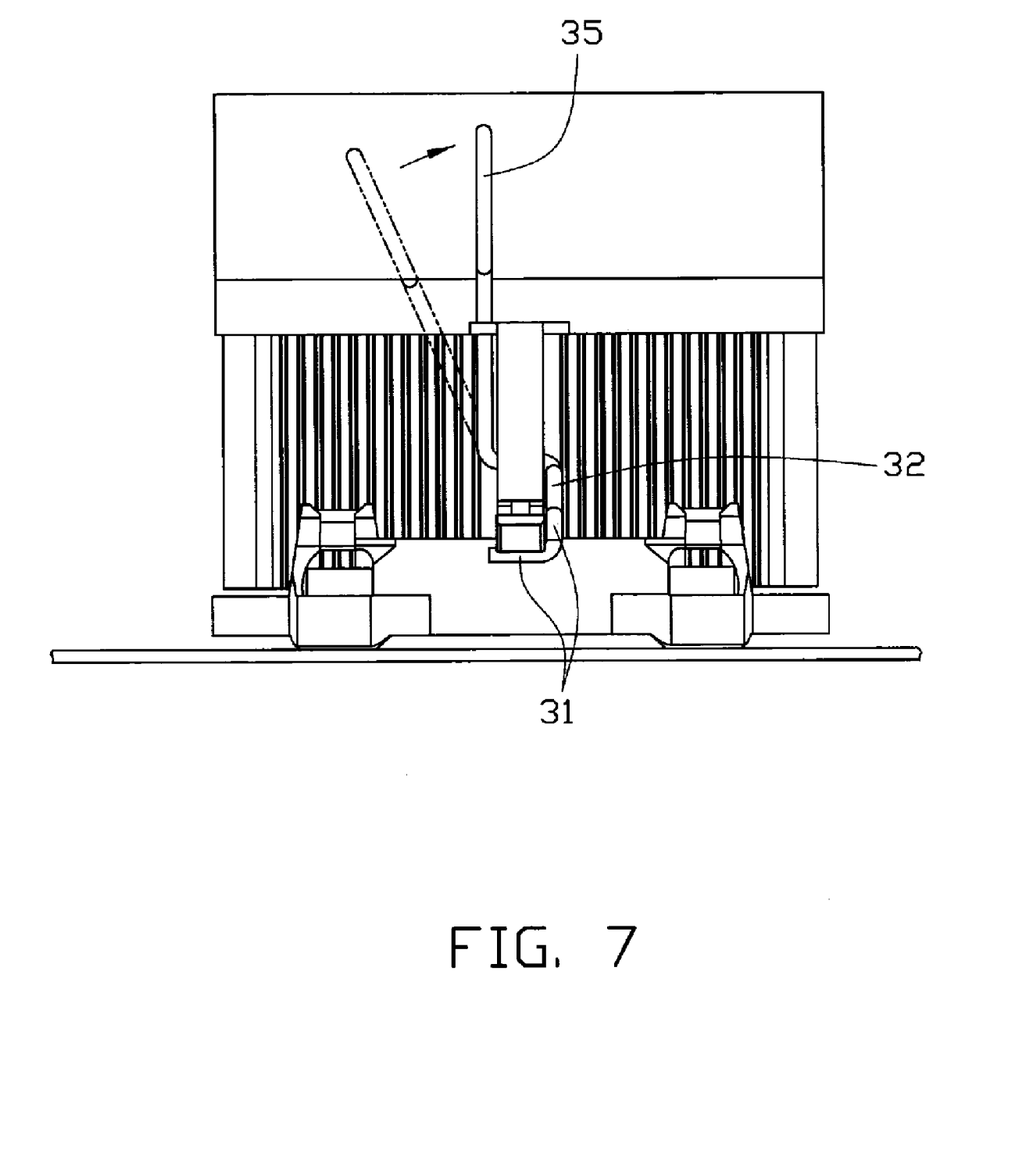
FIG. 7 is a side view of FIG. 1 with the clip located at a locked position.

As illustrated in FIGS. 3-7, each clip 30 comes is engaged by changing from an open position to an closed position. Solid lines showing the clip 30 in FIG. 3 display an initial position of the clip 30 in the open position after assembly of the heat dissipation device. In this state, the central axle 33 of each clip 30 is received in the grooves 160 and abuts against innermost sides of the grooves 160, and the operating portion 35 engages with the clasp 59 of the locking plate 52 of the fan bracket 50, and the locking portion 31 is loosened from the block 64 of the retention module 60 and is positioned above the block 64. In operation, the operating portion 35 is operated to rotate around the central axle 33 in a plane parallel to the baffle plate 58 of the fan bracket 50 so that the operating portion 35 is disengaged from the clasp 59 and arrives at a position shown in FIG. 3 with a broken line. In this position, the front elevation view of the heat dissipation device is shown in FIG. 4. The operation portion 35 is then rotated around the central axle 33 in a plane perpendicular to the baffle plate 58 to drive the operation portion to move away from the heat sink 10 and the central axle 33 moves along the grooves 160 of the heat sink 10 until the central axle 33 approaches the baffle plate 58; simultaneously, the locking portion 31 is actuated to move downwardly towards the block 64 of the retention module 60 by movement of the central axle 33. In this position, the front elevation view of the heat dissipation device is shown in FIG. 5. Then, the whole clip 30 is driven to move horizontally towards the heat sink 10; simultaneously, the central axle 33 is driven to move towards the innermost sides of the grooves 160 by action of the operating portion 35 until the central axle 33 abuts against the innermost sides of the grooves 160. At this position, the locking portion 31 of the clip 30 is driven to get below the concave surface 640 of the block 64 of the retention module 60, and a position of the clip 30 is shown by a solid line in FIG. 6. Next, the operating portion 35 is rotated around the central axle 33 and moves towards the heat sink, and the locking portion 31 located below the block 64 is actuated to move upwardly to engage with the concave surface 640 of the block 64 by movement of the central axle 33; simultaneously, a torque is generated by the central axle 33, which results in the operating portion 35 moving away from the heat sink 10. In this state, the clip 30 is shown by broken lines in FIGS. 6-7. Finally, the operating portion 35 is driven to rotate around the central axle 33 in the plane parallel to the baffle plate 58 to engage with the clasp 59, thus the heat sink 10 is firmly mounted on the retention module 60; in this state, the clip 30 is shown by solid lines thereof in FIG. 7. Process of disassembly is reverse of assembly process.

In this present invention, the clips 30 apply the leverage to optimize the operating force exerted on the operating portions 35 of the clips 30. The two wire clips 30 are located at lateral sides of the heat sink 10 to free space on the heat sink 10, thereby increasing heat dissipation area of the heat dissipation device.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. A heat dissipation device comprising:
a retention module comprising a plurality of sidewalls having a pair of opposite lateral sidewalls, a heat-generating electronic component received in the retention module and surrounded by the sidewalls, a pair of opposite fixture blocks being formed on the lateral sidewalls of the retention module;
a heat sink attached on the heat-generating electronic component in the retention module, a pair of opposite lateral sides of the heat sink defining grooves positioned corresponding to the fixture blocks of the retention module;
a fan bracket mounted on the heat sink, clasps being formed on a pair of opposite lateral sides of the fan bracket;
a fan mounted on the fan bracket; and
a pair of wire clips securing the heat sink to the retention module, each of the clips comprising an operating portion engaging with the clasp of the fan bracket, a central axle connecting with the operating portion and a locking portion connecting with the central axle;
wherein the central axle of each of the clips is slidably engaged in a corresponding groove of the heat sink and the locking portion of each of the clips engages with a corresponding fixture block of the retention module.

2. The heat dissipation device as claimed in claim 1, wherein the operating and locking portions of each of the clips are located at opposite sides of a corresponding groove defined in the heat sink.

3. The heat dissipation device as claimed in claim 1, wherein a perpendicular distance between a top end of the operating portion and the central axle is longer than a distance between a bottom end of the locking portion and the central axle.

4. The heat dissipation device as claimed in claim 1, wherein the central axle is linear and horizontal, and an extending direction of the central axle is perpendicular to that of a corresponding groove of the heat sink.

5. The heat dissipation device as claimed in claim 1, wherein the operating portion extends perpendicularly and upwardly from one free end of the central axle.

6. The heat dissipation device as claimed in claim 5, wherein a linear extension portion is bent slantingly downwardly from another free end of the central axle, the locking portion being bent from a free end of the extension portion.

7. The heat dissipation device as claimed in claim 6, wherein the operating portion has a P-shaped configuration, and the locking portion has an L-shaped configuration.

8. The heat dissipation device as claimed in claim 1, wherein portions of the blocks extend beyond the lateral sidewalls of the retention module and form concave surfaces at bottoms thereof.

9. The heat dissipation device as claimed in claim 8, wherein the locking portion engages with the concave surface of each of the blocks.

10. The heat dissipation device as claimed in claim 1, wherein the heat sink comprises a solid core and a plurality of fins extending from sides of the solid core.

11. The heat dissipation device as claimed in claim 10, wherein a pair of adjacent and spaced locating plates respectively extend from a pair of lateral sides of the core of the heat sink, and each of the locating plates parallel to the fins has a thickness thicker than that of each of the fins and has the same height as that of the fins.

12. The heat dissipation device as claimed in claim 11, wherein the fins located at opposite longitudinal sides of the heat sink cooperatively define a pair of opposite recesses at extremities of upper portions thereof.

13. The heat dissipation device as claimed in claim 12, wherein longitudinal sidewalls of the fan bracket form tongues extending inwardly therefrom for engaging in the recesses of the heat sink.

14. The heat dissipation device as claimed in claim 11, wherein the locating plates have tabs extending outwardly and horizontally beyond extremities of the fins, the tabs having a height shorter than that of the fins, the grooves being defined in the tabs of the locating plates.

15. The heat dissipation device as claimed in claim 14, wherein the grooves defined in the tabs of the locating plates have free ends for facilitating movement of the central axles of the clips therein.

16. The heat dissipation device as claimed in claim 15, wherein a pair of L-shaped locking plates are bent from a pair of lateral sidewalls of the fan bracket, corresponding to the locating plates of the heat sink, each of the locking plates comprises a supporting plate extending horizontally from the lateral sidewall of the bracket and a baffle plate perpendicularly and downwardly extending from a free end of the supporting plate.

17. The heat dissipation device as claimed in claim 16, wherein the clasps are formed on the supporting plates of the fan bracket, and the baffle plates abut against outer extremities of tabs of the heat sink to prevent the central axles of the clips from becoming separated from the grooves of the heat sink.

18. A heat sink assembly comprising:
a heat sink defining a pair of grooves in opposite lateral sides thereof, respectively;
a fan bracket mounted on a top side of the heat sink and having a pair of locking plates formed opposite lateral sides thereof, respectively, the locking plates extending downwardly to cover outsides of the grooves;
a pair of clips each having a central axle horizontally received in a corresponding groove, an operating portion extending upwardly from the central axle and engageable with a corresponding locking plate and a locking portion extending downwardly from the central axle and adapted for engaging with a retention module;
wherein a distance from a top of the operating portion to the central axle is larger than that between a bottom of the locking portion and the central axle, and wherein a rotation of the operating portion in respect to the central axle causes the locking portion to move accordingly.

19. The heat sink assembly as claimed in claim 18, wherein each of the locking plates has a horizontally extended supporting plate forming a clasp for engaging with the operating portion of a corresponding clip.

20. The heat sink assembly as claimed in claim 19 further comprising a fan mounted on the fan bracket.

* * * * *